United States Patent
Hwang et al.

(10) Patent No.: US 8,391,428 B2
(45) Date of Patent: Mar. 5, 2013

(54) AUTO GAIN CONTROL METHOD IN DIGITAL COMMUNICATION SYSTEM

(75) Inventors: Hyun Gu Hwang, Daejeon (KR); Hyeong Jun Park, Daejeon (KR); Hee Sang Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 751 days.

(21) Appl. No.: 12/543,815

(22) Filed: Aug. 19, 2009

(65) Prior Publication Data

US 2010/0158167 A1 Jun. 24, 2010

(30) Foreign Application Priority Data

Dec. 22, 2008 (KR) .................. 10-2008-0131280

(51) Int. Cl.
*H04B 1/10* (2006.01)
(52) U.S. Cl. ......... 375/350; 375/345; 375/346; 375/348
(58) Field of Classification Search .......... 375/229–232, 375/316, 322–325, 340, 346–350
See application file for complete search history.

(56) References Cited

U.S. PATENT DOCUMENTS

| | | | |
|---|---|---|---|
| 2006/0073823 A1* | 4/2006 | Kent et al. | 455/423 |
| 2007/0036249 A1* | 2/2007 | Shatara et al. | 375/347 |
| 2010/0060523 A1* | 3/2010 | Yamazaki et al. | 342/377 |

FOREIGN PATENT DOCUMENTS

| | | |
|---|---|---|
| JP | 2001-339321 | 12/2001 |
| JP | 2006-197654 | 7/2006 |
| JP | 2007/124411 * | 5/2007 |
| KR | 1996-0014672 | 10/1996 |
| KR | 10-0314921 | 2/2002 |
| KR | 10-0689400 | 3/2007 |
| KR | 10-0703828 | 4/2007 |
| KR | 1020070046480 | 5/2007 |
| KR | 1020070052020 | 5/2007 |
| KR | 1020070069824 | 7/2007 |
| KR | 1020080050192 | 6/2008 |

* cited by examiner

*Primary Examiner* — David C. Payne
*Assistant Examiner* — James M Perez
(74) *Attorney, Agent, or Firm* — Nelson Mullins Riley & Scarborough LLP; EuiHoon Lee, Esq.

(57) ABSTRACT

Provided is an auto gain control method in a digital communication system. The auto gain control method checks a distribution of a signal and a distribution of a signal envelope during a regular check interval, and determines a state of a current gain value from the distribution of the signal and the distribution of the signal envelope which are obtained through the checking of the distribution. The auto gain control method controls a gain value for auto gain control according to the determined state of the current gain value.

17 Claims, 8 Drawing Sheets

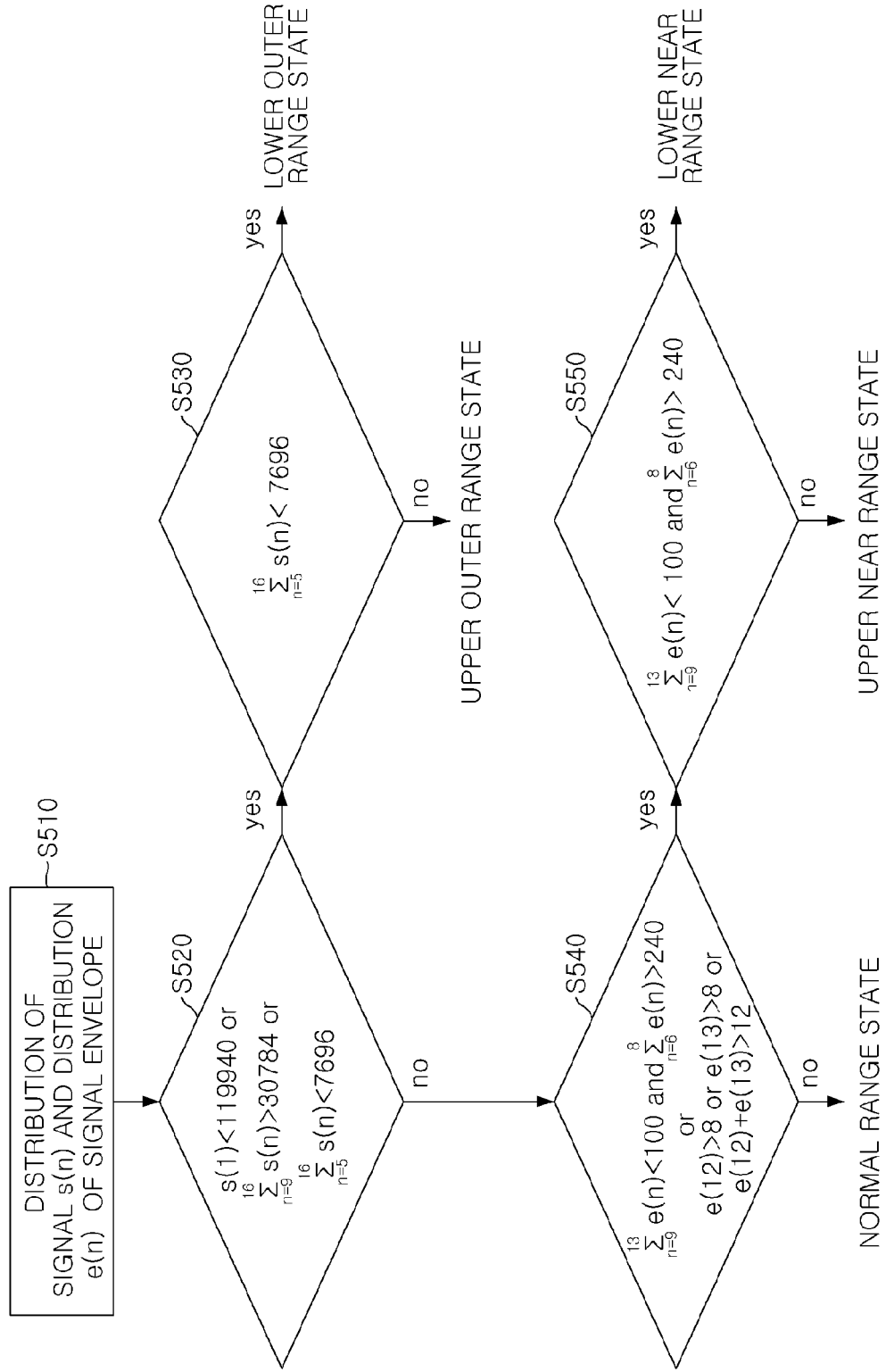

AUTO GAIN CONTROL METHOD IN DIGITAL COMMUNICATION SYSTEM

CROSS-REFERENCE TO RELATED APPLICATIONS

This application claims priority under 35 U.S.C. §119 to Korean Patent Application No. 10-2008-0131280, filed on Dec. 22, 2008, in the Korean Intellectual Property Office, the disclosure of which is incorporated herein by reference in its entirety.

TECHNICAL FIELD

The following disclosure relates to an automatic (abbreviated as "auto") gain control of a digital communication system, and in particular, to an auto gain control method in a digital communication system, which allows a terminal to efficiently perform Auto Gain Control (AGC) in the digital communication system where multiple users irregularly transmit data.

BACKGROUND

The digital communication system where multiple users irregularly transmit data (hereinafter referred to as a "discontinuous digital communication system) uses an auto gain control method similar to that of a digital communication system where a single user transmits a continuous data packet (hereinafter referred to as a "continuous digital communication system"). That is, based on a signal envelope or the average energy, an AGC gain value is determined in inverse proportion to the average.

A method for controlling the AGC gain value with the average is suitable for a continuous digital communication system, but is not suitable for a discontinuous digital communication system.

The reason is because a continuous digital communication system continuously receives data uninterrupted once communication is begun, while the discontinuous digital communication system does not uninterruptedly and continuously receive data or experiences a sudden change in signal energy. That is, when data are suddenly received after a period of data reception dormancy, or received signal energy suddenly changes, AGC is not performed well. In other words, since the auto gain control method has a large gain value for scaling a narrow region for a certain duration, data (which are suddenly received or change in signal energy) overrun the current scale region.

Accordingly, when the data signal is converted into a digital signal by an analog-to-digital converter, the maximum saturation value occurs or bit resolution decreases, causing a great amount of distortion.

SUMMARY

In one general aspect, an auto gain control method in a digital communication system includes: checking a distribution of a signal and a distribution of a signal envelope during a regular check interval; determining a state of a current gain value from the distribution of the signal and the distribution of the signal envelope which are obtained through the checking of a distribution; and controlling a gain value for auto gain control according to the determined state of the current gain value.

In another general aspect, an auto gain control method in a system having a plurality of antennas includes: calculating gain values of the antennas; and determining a least gain value of the calculated gain values as a gain value of all the antennas.

In another general aspect, an auto gain control method in a system including a plurality of antennas includes: controlling gains of the antennas with a plurality of gain values obtained from the antennas; transferring the controlled gain values to a demodulator; and performing, by the demodulator, coupling at a highest coupling rate based on the controlled gain values.

Other features and aspects will be apparent from the following detailed description, the drawings, and the claims.

BRIEF DESCRIPTION OF THE DRAWINGS

FIG. 5 is a flowchart schematically illustrating an example of an algorithm for determining the state of the current gain value according to an exemplary embodiment.

DETAILED DESCRIPTION OF EMBODIMENTS

Figure 1:
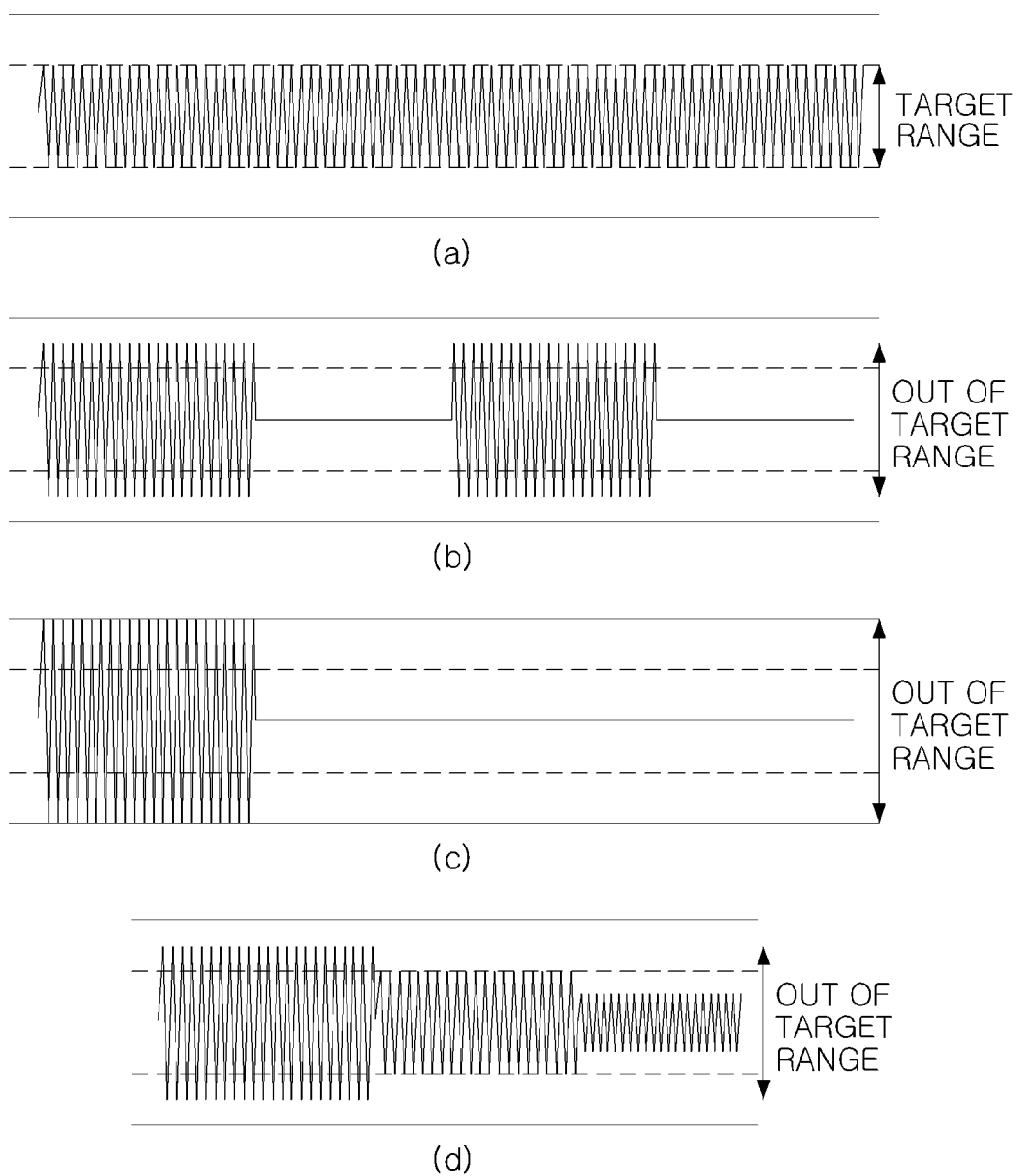
FIG. 1 is a diagram illustrating limitations in an auto gain control method using a power.

Hereinafter, exemplary embodiments will be described in detail with reference to the accompanying drawings. Throughout the drawings and the detailed description, unless otherwise described, the same drawing reference numerals will be understood to refer to the same elements, features, and structures. The relative size and depiction of these elements may be exaggerated for clarity, illustration, and convenience. The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a diagram illustrating limitations in an auto gain control method using a power.

FIG. 1(a) illustrates the waveform of an auto gain-controlled signal when data are continuously received during an arbitrary transmission section (T). In FIG. 1(a), AGC is accurately performed, and thus the swing width of the signal waveform is maintained within a target range.

FIG. 1(b) illustrates the waveform of an auto gain-controlled signal when data are received only during the T/2 time of the arbitrary transmission section (T). FIG. 1(c) illustrates the waveform of an auto gain-controlled signal when data are received only during the T/4 time of the arbitrary transmission section (T). FIG. 1(d) illustrates the waveform of an auto gain-controlled signal when data having a power higher than an average power are received only during the front T/3 time of the arbitrary transmission section (T), data having the average power are received during the middle T/3 time of the arbitrary transmission section (T) and data having a power lower than the average power are received during the rear T/3 time of the arbitrary transmission section (T). In FIGS. 1(b) to 1(d), because of using the average of a signal energy, the AGC is inaccurately performed and thus the swing widths of the signal waveforms are not maintained within the target range.

Figure 2:
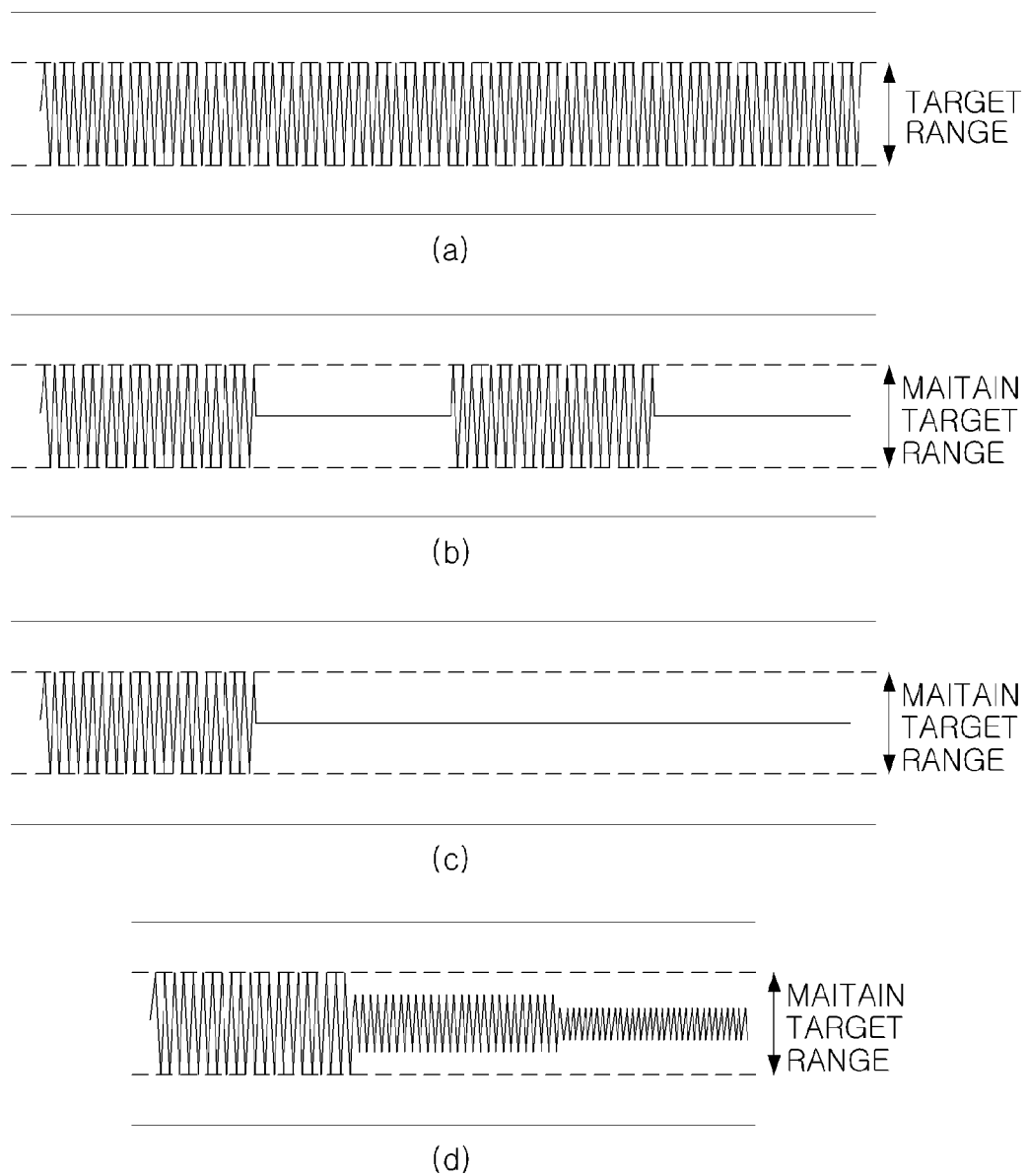
FIG. 2 is a diagram illustrating the waveforms of auto gain-controlled signals based on an auto gain control method according to an exemplary embodiment.

FIG. 2 is a diagram illustrating the waveforms of auto gain-controlled signals based on an auto gain control method according to an exemplary embodiment.

FIGS. 2(a) to 2(d) illustrates the waveforms of auto gain-controlled signals when data are received during the T time, T/2 time and T/4 of the arbitrary transmission section (T) and the energy of the received data is changed, respectively. In FIGS. 2(a) to 2(d), all the swing widths of the signals are accurately maintained within the target range.

Figure 3:
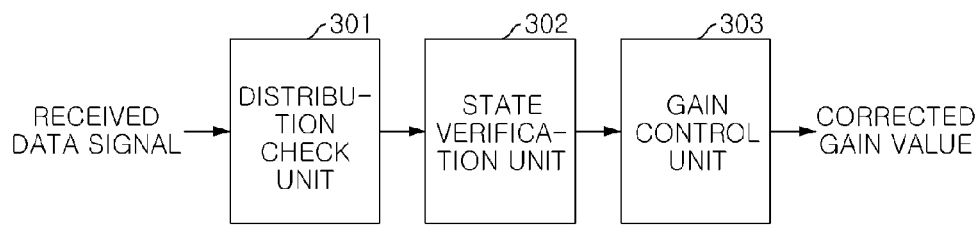
FIG. 3 is a block diagram of the auto gain control apparatus according to an exemplary embodiment.

FIG. 3 is a block diagram of the auto gain control apparatus according to an exemplary embodiment.

Referring to FIG. 3, an auto gain control apparatus according to an exemplary embodiment includes a distribution check unit 301, a state verification unit 302 and a gain control unit 303. The gain control unit 303 controls a current gain value for AGC according to the state of a gain value which is determined by the distribution check unit 301 and the state verification unit 302. The auto gain control apparatus may be applied to all wired/wireless communication systems using a digital system, and particularly may provide the highest performance in a discontinuous digital communication system.

The distribution check unit 301 checks two distributions for a received data signal. Specifically, the distribution check unit 301 checks the distribution of the signal itself and the distribution of a signal envelope.

The distribution of the signal itself means a magnitude distribution of a received digital signal. The received data signal has the Gaussian distribution having an average of 0. The magnitude distribution of the signal is made by multiplying the '+' portion of the Gaussian distribution by two.

Actual hardware has difficulty in accurately checking the distribution of a signal itself. Consequently, the distribution may be roughly checked through several steps to tens steps.

In an exemplary embodiment, an input is 14 bits, and magnitude steps are set to total sixteen steps. In this case, the each step may set a boundary as a multiple of 512. That is, the range of an input signal is from −8191 to +8191, the first step of the sixteen steps is set as a range from 0 to 511, the second step of the sixteen steps is set as a range from 512 to 1023, and the last step of the sixteen steps is set as a range from 7680 to 8191. The distribution may be obtained by use of a bar graph which represents the number of samples per step.

Although the distribution of the signal envelope may be obtained in various methods, an exemplary embodiment calculates the distribution of the signal envelope by accumulating the absolute value of the signal for a certain time. That is, when the number of the absolute values of the signals which are received for the certain time is "a", the one sample of the signal envelope is calculated as a sum of the a number of absolute values. For example, it is assumed that 614400 samples which are obtained by summing a real part and an imaginary part for a time of 10 ms are inputted. If the signal envelope is set as a value where the absolute values of 512 signals are continuously accumulated, total 1200(=614400/512) envelope values are obtained.

Likewise, a plurality of steps are set for checking the distribution of the signal envelope. For example, a first step of the steps is set as a range from 0 to 70,000 the second step of the steps is set as a range from 70,000 to 140,000. The twelfth step of the steps is set as a range from 770,000 to 840,000, and the thirteenth step of the steps may be set as a range of 840,000 or more. The distribution of the signal envelope may also obtain a value of the each step (which is a step value) by use of a bar graph.

The state verification unit 302 verifies the state of a current gain value for AGC by using the distribution of the signal envelope and the distribution of the signal which are checked by the distribution check unit 301.

The state of the gain value may be divided into the following three states.

A first state is an outer range state where a current gain value is out of a target gain value. That is, the outer range state is a state where the current gain value is greater than a first maximum reference value or less than a first minimum reference value with respect to the target gain value.

A second state is a near range state where the current gain value is near the target gain value or has small difference with it. That is, the near range state is a state where the current gain value is between the first maximum reference value and a second maximum reference value less than the first maximum reference value or between the first minimum reference value and a second minimum reference value greater than the first minimum reference value with respect to the target gain value.

A third state is a normal range state where the current gain value is similar to the target gain value. That is, the normal range state is a state where the current gain value is between the second maximum reference value and the second minimum reference value.

The first to third states may be determined using the distribution of the signal, the distribution of the signal envelope or all the distributions.

Throughout specification, the distribution of a signal is represented as s(n), and the distribution of a signal envelope is represented as e(n). Herein, 'n' in parenthesis refers to each step.

FIGS. 4A to 4E are bar graphs illustrating the distribution of a signal envelope and the distribution of a signal based on the state of a current gain value for AGC according to an exemplary embodiment. In FIGS. 4A to 4E, the distribution of the left is the distribution of the signal, and the distribution of the right is the distribution of the signal envelope.

Figure 4A:
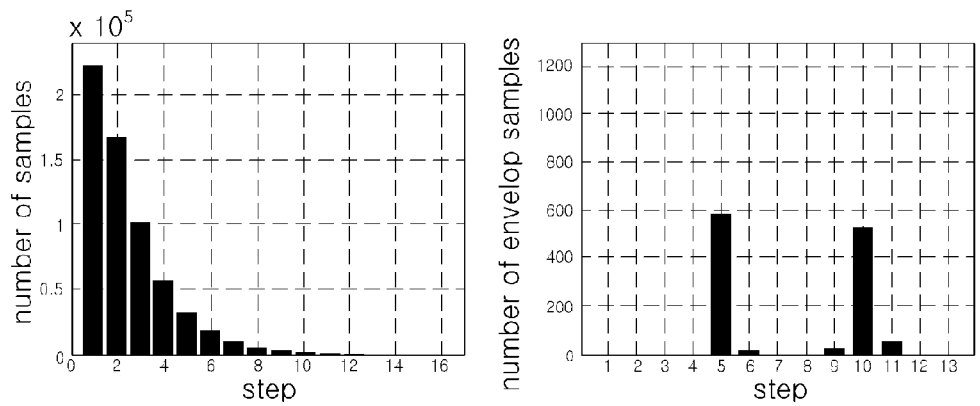
FIGS. 4A to 4E are bar graphs illustrating the distribution of a signal envelope and the distribution of a signal based on the state of a current gain value for AGC according to an exemplary embodiment.
Figure 4B:
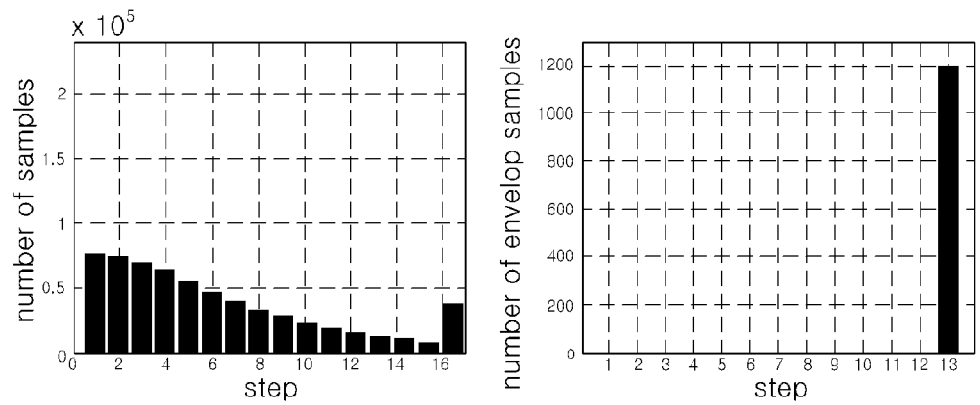
Figure 4C:
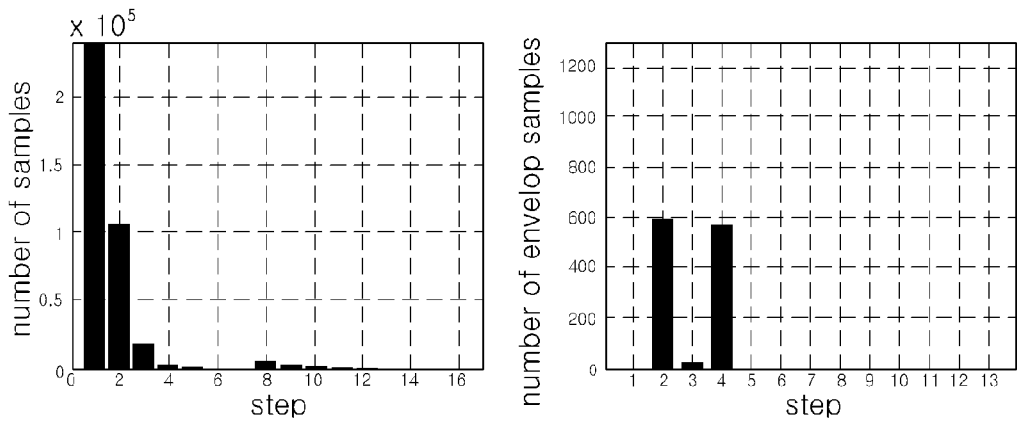
Figure 4D:
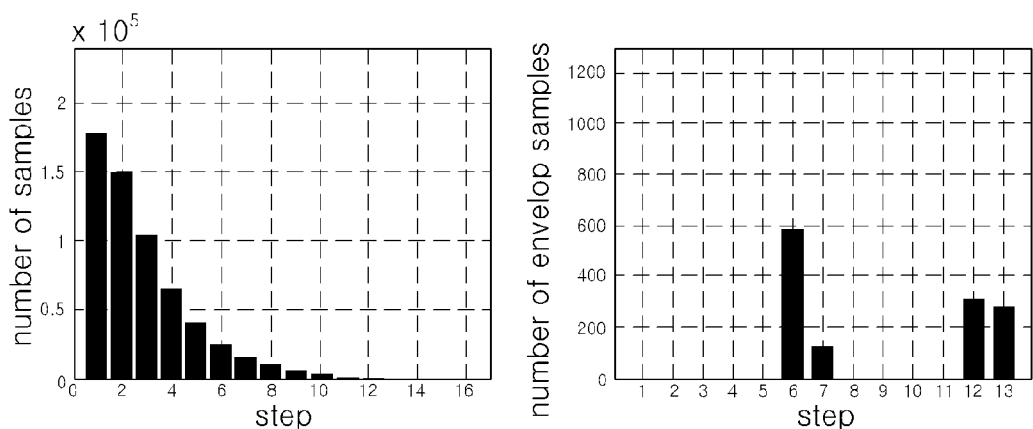
Figure 4E:
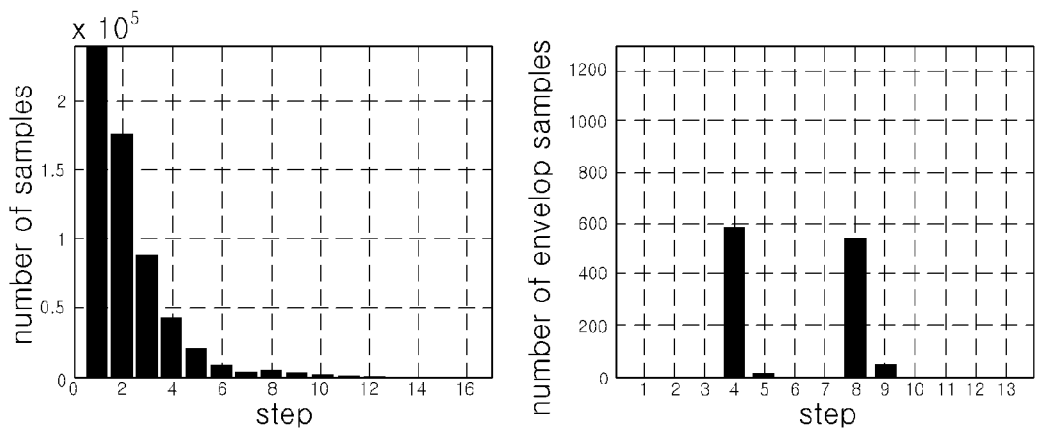

FIG. 4A illustrates an upper outer range state, FIG. 4B illustrates a lower outer range state, FIG. 4C illustrates an upper near range state, FIG. 4D illustrates a lower near range state, and FIG. 4E illustrates a normal range state. Herein, the distribution of the signal is a distribution based on the assumption of that a real part and an imaginary part are 307,200 samples respectively, and total 614,400 samples are received for a time of 10 ms as a 14-bit signal. Accordingly, 1,200 samples are obtained through the distribution of the signal. As described above, the distribution of the signal is composed of sixteen steps, and the distribution of the signal envelope is composed of twelve steps. The distribution step of the signal increases by 512 per step, and the distribution step of the signal envelope increases by 70,000 per step. It is assumed that data exist only at a check time of 5 ms being half of a check time of 10 ms.

Throughout specification, the above-described environment is applied to the following embodiments as-is. In FIGS. 4A to 4E, an exemplary embodiment has applied a signal to noise ratio (SNR) of 5 dB.

As shown in FIGS. 4A to 4B, the outer range state may be determined with the distribution of the signal, and may be divided into a state where the current gain value is far greater than the target gain value and a state where the current gain value is far less than the target gain value. That is, the outer range state may be divided into the upper outer range state and the lower outer range state.

In the upper outer range state, the distribution of the signal may have great values at high steps. In the lower outer range state, the distribution of the signal may have great values at low steps. In a communication environment receiving discontinuous data, the values of the low steps in the distribution of the signal are great. This reason is because noise having a small value only exists for a time when data are not received. Accordingly, the value of the first step in the distribution of the signal is great. Therefore, a lower outer range may not be determined by only the reason that the values of the low steps in the distribution of the signal are great.

When determining the lower outer range state in consideration of these, a state is considered where a sum of all the values of the steps higher than a predetermined step is less than a predetermined threshold value. For example, when a sum of all the values of the steps higher than a 5(i=5) step (which is $$\sum_{n=5}^{16} s(n))$$

is less than the predetermined threshold value, the current gain value is determined as far less than the target gain value.

When determining the upper outer range state, a state is considered where a sum of all the values of the steps higher than the predetermined step is greater than a predetermined threshold value. For example, when a sum of all the values of the steps higher than a 9(i=9) step (which is $$\sum_{n=9}^{16} s(n))$$

is greater than a predetermined threshold value, the current gain value is determined as far greater than the target gain value. When the value of the first step in the distribution of the signal is less than the predetermined threshold value, the current gain value is also determined as greater than the target gain value.

The outer range state may be determined using the distribution of the signal envelope.

The distribution of the signal envelope is concentrated to an upper step in the upper outer range state, whereas is concentrated to a lower step in the lower outer range state. Consequently, when a sum of the values of the steps higher than a predetermined upper step exceeds the predetermined threshold value, the state of the current gain value may be determined as the upper outer range state. Moreover, when a sum of the values of the steps higher than a predetermined lower step does not exceed the predetermined threshold value, the state of the current gain value may be determined as the lower outer range state.

The near range state may be divided into a state where the current gain value is slightly greater than the target gain value and a state where the current gain value is slightly less than the target gain value, i.e., may be divided into the upper near range state and the lower near range state.

As shown in FIGS. 4C and 4D, it is difficult to determine the upper near range state with the values of the upper steps. This reason is because the values of the upper steps in the distribution of the signal are greatly changed according to whether actual data exist or not. As a result, the distribution of the signal envelope is necessarily used.

In the distribution of the signal envelope, the most important data are the distribution characteristic of the upper steps. This reason is because the envelope of an actual received signal is distributed in the direction of the upper steps.

A state, where the values of the upper steps exceed the threshold value or a sum of the values of the steps higher than the predetermined upper step exceeds the threshold value, is determined as the upper near range state in the distribution of the signal envelope.

As an example, when the values of the upper steps (for example, e(12) or e(13)) in the distribution of the signal envelope is greater than the predetermined threshold value or a sum of the values of the upper steps (for example, e(12)+e(13)) is greater than the predetermined threshold value, the state of the current gain value is determined as the upper near range state.

Like the determination of the upper near range state, the distribution of the signal envelope is also used in the determination of the lower near range state. That is, when a sum of the values of the steps higher than the predetermined step is less than the predetermined threshold value and a sum of the values of the steps lower than the predetermined step is greater than the predetermined threshold value, the lower near range state is determined in the distribution of the signal envelope. As an example, when a sum of all the values of the steps higher than a 9(k=9) step (which is $$\sum_{n=9}^{13} e(n))$$

in the distribution of the envelope is less than the predetermined threshold value and a sum of all the values of the 6 to 7 steps lower than the 9 step (which is $$\sum_{n=6}^{8} e(n))$$

in the distribution of the envelope is greater than the predetermined threshold value, the lower near range state is determined.

The normal range state refers to another state that is not the outer range state or the near range state, and is illustrated in FIG. 4E. Such a state means a state where the current gain value is far closer to the target gain value.

FIG. 5 is a flowchart schematically illustrating an example of an algorithm for determining the state of the current gain value according to an exemplary embodiment.

First, the auto gain control apparatus checks the distribution "s(n)" of the signal and the distribution "e(n)" of the signal envelope in operation S510.

The auto gain control apparatus determines whether the state of the current gain value is the outer range state in operation S520. Specifically, when the distribution "s(1)" is less than 119,940, the sum $$"\sum_{n=9}^{16} s(n)"$$

is less greater than 30,784 or the sum $$"\sum_{n=5}^{16} s(n)"$$

is less than 7,696, the auto gain control apparatus determines the current gain value as the outer range state.

When the state of the current gain value is determined as the outer range state, the auto gain control apparatus determines whether the sum $$"\sum_{n=5}^{16} s(n)"$$

is less than 7,696 in operation S530. When the determination result shows that the sum $$"\sum_{n=5}^{16} s(n)"$$

is less than 7,696, the auto gain control apparatus determines the current gain value as the lower outer range state. When the determination result shows that the sum $$"\sum_{n=5}^{16} s(n)"$$

is greater than 7,696, the auto gain control apparatus determines the current gain value as the upper outer range state.

When the determination result of operation S520 shows that the state of the current gain value is not the outer range state, the auto gain control apparatus determines whether the state of the current gain value is the normal range state or is the near range state in operation S540. When the sum $$"\sum_{n=9}^{13} e(n)"$$

is less than 100 and the sum $$"\sum_{n=6}^{8} e(n)"$$

is greater than 240, the state of the current gain value is determined as the lower near range state, and when the value of the step "e(12)" or the step "e(13)" is greater than 8 or the sum "e(12)+e(13)" is greater than 12, the state of the current gain value is determined as the upper near range state in operation S550. Other states are determined as the normal range state in operation S540.

When the determination has been completed on the state of the current gain value, the auto gain control apparatus controls the current gain value according to a result of the determination. Such a control process for the current gain value is performed through the gain control unit 303 in FIG. 3.

A gain control method based on each state will be described below.

When the upper outer range state among the outer range states, the auto gain control apparatus multiplies the current gain value by a constant value less than 1. When the lower outer range state, the auto gain control apparatus multiplies the current gain value by a constant value greater than 1. At this point, the constant value is suitably selected according to the characteristics of a system.

In the upper outer range state, if the constant value is very small, the current gain value may rapidly converge to the normal range state, but the current gain value may exceed the normal range state and be the lower outer range state again. Therefore, a suitable constant value is determined in accordance with the characteristics of the system. Even in the lower outer range state, the constant value is suitably determined in accordance with the characteristics of the system.

When the lower near range state among the near range states, the auto gain control apparatus multiplies the current gain value by a suitable constant value greater than 1. At this point, because the constant value exceeds the normal range state and again is the upper near range state when the constant value is very great, a suitable constant value is determined in accordance with the characteristics of the system.

When the upper near range state, the auto gain control apparatus multiplies the current gain value by a suitable constant value less than 1. At this point, because the constant value exceeds the normal range state and again is the lower near range state when the constant value is very small, a suitable constant value is determined in accordance with the characteristics of the system.

In the case of the upper near range state, another gain control method exists. This method is the same as a gain control method in the normal range state. Accordingly, for convenience, the gain control method in the normal range state will be described first, and the other gain control method in the upper near range state will be described.

When the normal range state, as described above, the difference between the current gain value and the target gain value is not great. However, the current gain value is gradually and continuously corrected toward the target gain value for suitably meeting the continuous change of the signal.

Since a digital communication system continuously maintains this state, the gain value of this state may be controlled more accurately. Accordingly, the auto gain control apparatus may use both the distribution of the signal and the distribution of the signal envelope which are checked through the distribution check unit 301 in FIG. 3.

Figure 6A:
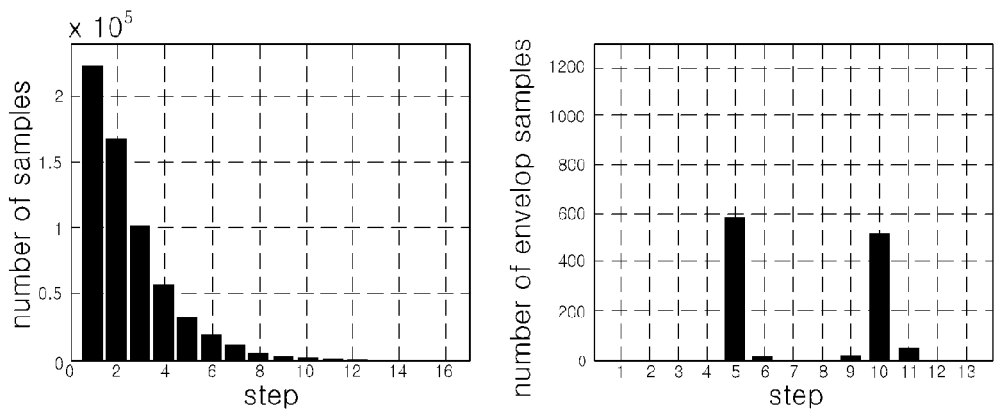
FIGS. 6A to 6C are diagrams illustrating the distribution of the signal and the distribution of the signal envelope based on SNR in the normal range state.
Figure 6B:
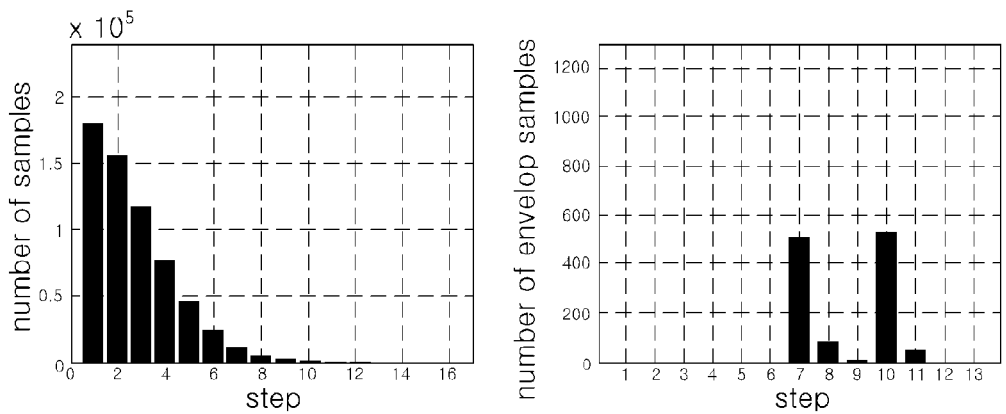
Figure 6C:
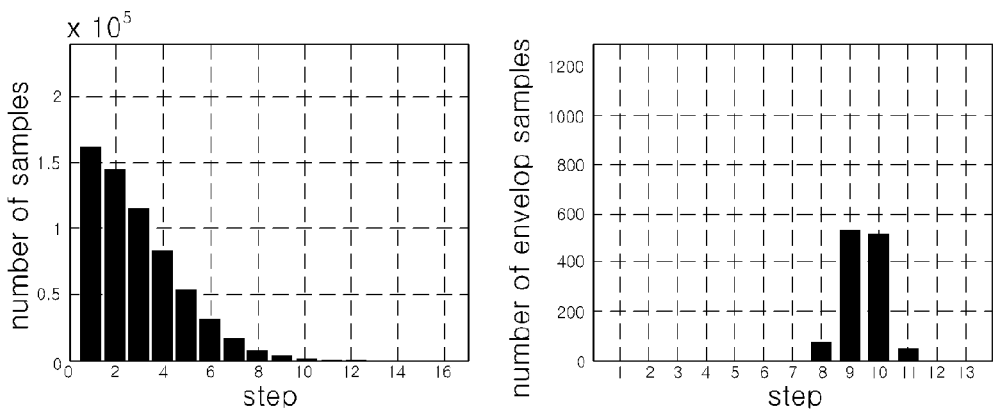

FIGS. 6A to 6C are diagrams illustrating the distribution of the signal and the distribution of the signal envelope based on SNR in the normal range state.

When data exist only at a check time of 5 ms being half of a check time of 10 ms, the distributions in FIG. 6A illustrate ideal states on the distribution of the signal and the distribution of the signal envelope when the SNR is 5 dB, the distributions in FIG. 6B illustrate ideal states on the distribution of the signal and the distribution of the signal envelope when the SNR is 0 dB, and the distributions in FIG. 6C illustrate ideal states on the distribution of the signal and the distribution of the signal envelope when the SNR is −5 dB. In FIGS. 6A to 6C, the distribution of the left is the distribution of the signal, and the distribution of the right is the distribution of the signal envelope.

In the distribution of the signal which is illustrated to the left in FIGS. 6A to 6C, it is difficult to determine whether the distribution of the signal is concentrated to any step. In the distribution of the signal which is illustrated to the right in FIGS. 6A to 6C, however, it is possible to determine whether the distribution of the signal envelope is concentrated to any step.

When 5 dB and 0 dB, a signal (which is distributed at high steps) and a noise (which is distributed at low steps) are clearly discriminated in the distribution of the signal envelope.

When −5 dB, however, it is difficult to clearly discriminate the signal and the noise in the distribution of the signal envelope. That is, because a step (at which the noise is distributed) is mixed with a step at which the signal is distributed, it is difficult to clearly discriminate the signal and the noise.

In an exemplary embodiment, the signal (which appears in the distribution of the signal envelope in FIGS. 6A to 6C) is distributed at the 9 to 11 steps in common, and particularly is intensively distributed at the 10 step.

Such a common distribution characteristic is the substantial purpose of the system. Therefore, if a current signal envelope is not distributed at the 9 to 11 steps, the auto gain control apparatus changes a gain value in order for the current signal envelope to be distributed at the 9 to 11 steps.

First, the gain control method in the normal range state according to an exemplary embodiment calculates a component ratio in the distribution of the signal envelope. Herein, the component ratio is made by dividing an optimal value for a sum of all the values of the steps (which are higher than an nth step in the distribution of a current signal) by a sum (i.e., a complete value) of all the values of the steps higher than the nth step in the distribution of the signal, under a communication environment which continuously transmits data without cease. Herein, the nth step is higher than the 1 step, and is lower than an N step being the final step.

Second, the auto gain control apparatus multiplies the component ratio by the complete value to calculate the theoretical value for a sum of all the values of the steps equal to or higher than the nth step in the distribution of the signal.

Third, the auto gain control apparatus calculates a position value, which is disposed in the actual distribution of the signal, from the theoretical value.

Fourth, the auto gain control apparatus divides the start position value of the nth step by the calculated position value to calculate a correction coefficient.

Finally, the auto gain control apparatus performs a multiplication operation on the correction coefficient and the current gain value to calculate a correction gain value.

In the above-described process, the component ratio may be obtained through various methods. An exemplary embodiment proposes a method that multiplies the upper steps of the signal envelope by a control constant, sums the multiplied values and adds a correction value to the summed value, thereby correcting a value. This method calculates the component ratio by dividing the corrected value by total the number of the samples of the envelope. For example, the component ratio may be calculated through an operation "(0.5 e(9)+e(10)+0.5 e(11)+24)/1200".

The method for calculating the component ratio may be further subdivided using the distribution of the signal envelope. The subdividing method according to an exemplary embodiment is based on the number of peaks, the length of the rightmost peak.

In the distribution of the signal envelope, a peak may be defined as a state where any step is greater than the threshold value and is greater than the value of a preceding step or the value of a succeeding step.

The first step or the last step on the boundary may also be the peak. For example, in a state where the threshold value is 60, the step "e(10)" may be referred to as the peak when the values of the steps "e(9) to e(11)" are 100, 800 and 70 respectively.

The auto gain control apparatus checks total five steps that include three steps higher than and one step lower than a step having the rightmost peak, and the length of the rightmost peak may be defined as the number of the steps having a value greater than the threshold value among the checked steps.

The auto gain control apparatus sets a lower saturation value and an upper saturation value. The auto gain control apparatus saturates the component ratio to the lower saturation value when the calculated component ratio is lower than the lower saturation value. The auto gain control apparatus saturates the component ratio to the upper saturation value when the calculated component ratio is higher than the upper saturation value.

The calculated component ratio may have a lower saturation value and an upper saturation value in order to ensure stability for the system. As an example, when the component ratio is lower than 0.25, the component ratio is defined as 0.25, and when the component ratio is higher than 1, the component ratio is defined as 1.

Figure 7:
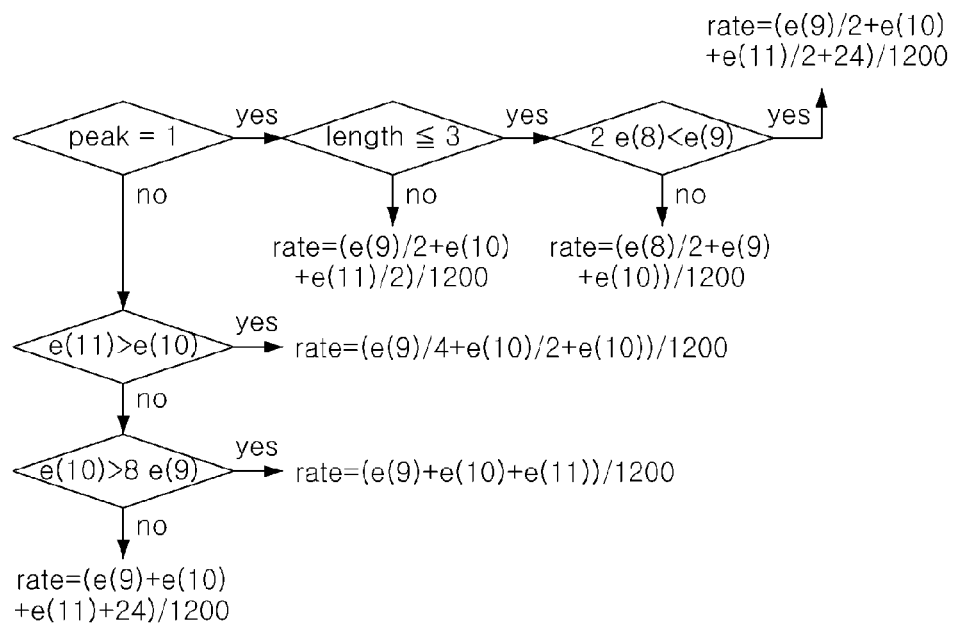
FIG. 7 is a flowchart illustrating an example of an algorithm for calculating the subdivided component ratio of the normal range state.

FIG. 7 is a flowchart illustrating an example of an algorithm for calculating the subdivided component ratio of the normal range state. Herein, a peak is depicted as "peak", the number of the rightmost peaks is depicted as "length", and the component ratio is depicted as "rate".

Referring to FIG. 7, by using the peak, the length and the distribution conditions of the signal envelope, an exemplary embodiment subdivides and calculates the component ratio.

Figure 8:
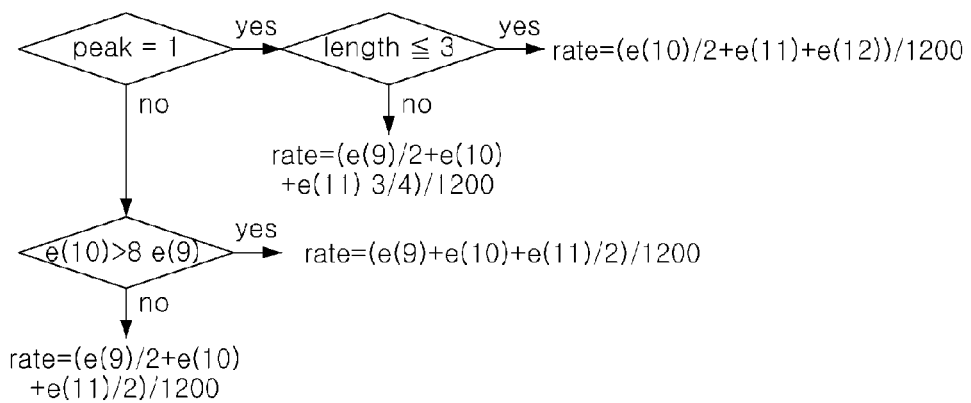
FIG. 8 is a flowchart illustrating an example of an algorithm for calculating the component ratio of the upper near range state.

FIG. 8 is a flowchart illustrating an example of an algorithm for calculating the component ratio of the upper near range state.

Referring to FIG. 8, when the upper near range state, an algorithm for the normal range state may be used as another gain control method for a gain value. Such an exemplary embodiment also uses the peak, the length and the distribution conditions of the signal envelope, and thus, subdivides and calculates the component ratio.

Figure 9:
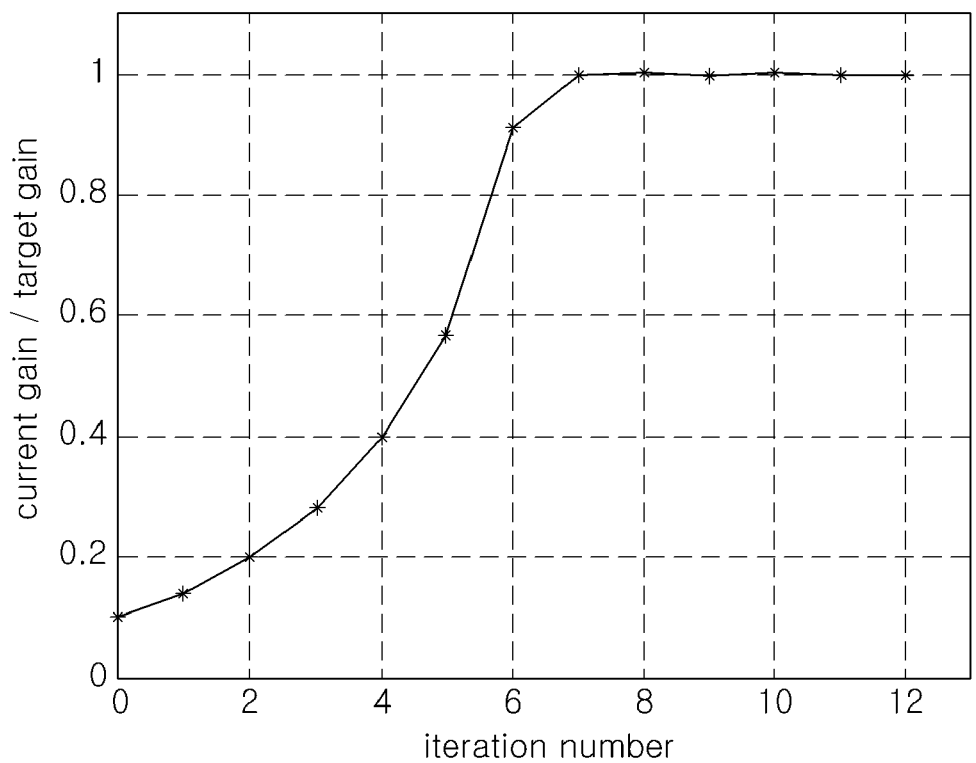
FIG. 9 is a graph illustrating a gain value converging to a target value according to an exemplary embodiment.

FIG. 9 is a graph illustrating a gain value converging to a target value according to an exemplary embodiment.

It is seen through the graph of FIG. 9 that the gain value of the lower outer range state reaches the normal range state by the algorithm according to an exemplary embodiment.

At first, the current gain value is one-tenth of the target gain value. When iteration number increases and thus the current gain value is 7, it is seen that the current gain value almost converges to the target gain value.

If a receiver includes a plurality of antennas, a gain value is calculated from the each antenna through the above-described methods. The least gain value of the calculated gain values may be determined as the gain values of all antenna signals. Accordingly, an exemplary embodiment prevents the antenna signals from being saturated in spite of use of the same gain value. Moreover, an exemplary embodiment makes an environment where a demodulator couples at the highest coupling rate.

Operating the each antenna with an autonomously-calculated value and transferring the calculated value to the demodulator is more efficient for the configuration of the system, relative to the above-described system. This reason is because a signal maintains bit resolution which is enhanced though an analog-to-digital converter.

The auto gain control method in the digital communication system according to an exemplary embodiment allows a signal to efficiently converge to a desired region and maintains the converging signal, relative to a related art auto gain control method which is based on only the average of energy or a signal envelope.

The invention can also be embodied as computer readable codes on a computer-readable storage medium. The computer-readable storage medium is any data storage device that can store data which can be thereafter read by a computer system. Examples of the computer-readable storage medium include ROMs, RAMs, CD-ROMs, DVDs, magnetic tapes, floppy disks, registers, buffers, optical data storage devices, and carrier waves (such as data transmission through the Internet). The computer-readable storage medium can also be distributed over network coupled computer systems so that the computer readable codes are stored and executed in a distributed fashion. Also, functional programs, codes, and code segments for accomplishing the present invention can be easily construed by programmers skilled in the art to which the present invention pertains.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An auto gain control method in a digital communication system, comprising:
   checking a distribution of a packet signal and a distribution of a signal envelope during a regular check interval, wherein the checking of a distribution comprises calculating and obtaining the distribution of the packet signal and the distribution of the signal envelope with an absolute value of a signal which is received during the regular check interval, wherein the absolute value has a real part absolute value and an imaginary part absolute value;
   determining a state of a current gain value from the distribution of the packet signal and the distribution of the signal envelope which are obtained through the checking of a distribution; and
   controlling the current gain value for auto gain control according to the determined state of the current gain value.

2. The auto gain control method of claim 1, further comprising adding the a (where 1<a) number of absolute values of the signal, which is received during the regular check interval, to obtain one sample of the signal envelope.

3. The auto gain control method of claim 1, wherein the checking of a distribution comprises:
   dividing an entire distribution range of the signal and an entire distribution range of the signal envelope into two or more steps respectively, and determining the number of signals included in each of the steps as a value of the each step; and
   checking the distribution of the signal and the distribution of the signal envelope on the basis of the value of the each step.

4. The auto gain control method of claim 1, wherein the determining of a state comprises:
   determining whether the state of the current gain value is an outer range state which comprises an upper outer range state greater than a first maximum reference value or a lower outer range state less than a first minimum reference value with respect to a target gain value;
   determining whether the state of the current gain value is a near range state which comprises an upper near range state between the first maximum reference value and a second maximum reference value (which is less than the first maximum reference value) or a lower near range state between the first minimum reference value and a second minimum reference value (which is greater than the first minimum reference value) with respect to the target gain value; and
   determining a state of the current gain value as a normal range state, when the current gain value is between the second maximum reference value and the second minimum reference value.

5. The auto gain control method of claim 4, wherein the determining of an outer range state comprises determining a state where a sum of all values of a plurality of steps higher than a predetermined step is greater than a predetermined threshold value in the distribution of the signal or a state where a value of a first step in the distribution of the signal is less than the threshold value, as the upper outer range state.

6. The auto gain control method of claim 4, wherein the determining of an outer range state comprises determining a state, where a sum of all values of a plurality of steps higher than a predetermined step is less than a predetermined threshold value, as the lower outer range state in the distribution of the signal.

7. The auto gain control method of claim 4, wherein the determining of an outer range state comprises determining a state, where a sum of all values of a plurality of steps higher than a predetermined upper step is greater than a predetermined threshold value, as the upper outer range state in the distribution of the signal envelope.

8. The auto gain control method of claim 4, wherein the determining of an outer range state comprises determining a state, where a sum of all values of a plurality of steps higher than a predetermined lower step is less than a predetermined threshold value, as the lower outer range state in the distribution of the signal envelope.

9. The auto gain control method of claim 4, wherein the determining of a near range state comprises determining a state, where any value of step higher than an upper step exceed a predetermined first threshold value or a sum of values of a plurality of steps higher than the upper step exceeds a predetermined second threshold value, as the upper near range state in the distribution of the signal envelope.

10. The auto gain control method of claim 4, wherein the determining of a near range state comprises determining a state where a sum of values of a plurality of steps higher than a predetermined step is less than a predetermined first threshold value and a state where a sum of values of the a (where 0<a) number of steps lower than the predetermined step is greater than a predetermined second threshold value, as the lower near range state in the distribution of the signal envelope.

11. The auto gain control method of claim 4, wherein the controlling of the current gain value comprises:
   multiplying the current gain value by a constant less than 1 to control the gain value, when the state of the current gain value is the upper outer range state; and
   multiplying the current gain value by a constant greater than 1 to control the gain value, when the state of the current gain value is the lower outer range state.

12. The auto gain control method of claim 4, wherein the controlling of the current gain value comprises:
- multiplying the current gain value by a constant less than 1 to control the gain value, when the state of the current gain value is the upper near range state; and
- multiplying the current gain value by a constant greater than 1 to control the gain value, when the state of the current gain value is the lower near range state.

13. The auto gain control method of claim 1, wherein the controlling of a gain value in the normal range state comprises:
- calculating a component ratio in the distribution of the signal envelope;
- multiplying the component ratio by a complete value to calculate a theoretical value for a sum of all values of a plurality of steps higher than an nth step in the distribution of the signal;
- calculating a position value where the theoretical value is located in the distribution of the signal;
- dividing a start position value of the nth step by the position value to obtain a correction coefficient; and
- multiplying the current gain value by the correction coefficient to determine a correction gain value,
  wherein:
  the component ratio is made by dividing an optimal value for a sum of all the values of the steps (which are higher than the nth step in the distribution of the signal) by a sum (i.e., a complete value) of all the values of the steps higher than the nth step in the distribution of the signal, under a communication environment which continuously transmits data, and
  the nth step is higher than a 1 step and is lower than an N step being a final step.

14. The auto gain control method of claim 13, wherein the calculating of a component ratio comprises:
- multiplying values of a plurality of predetermined upper steps of the signal envelope by control constants (which are real numbers less than 1), summing the multiplied values, and adding a compensation value to the summed value; and
- dividing the compensated value by the number of total samples of the envelope to calculate the component ratio.

15. The auto gain control method of claim 13, wherein the calculating of the component ratio comprises calculating the component ratio which is subdivided using the number of peaks and a length of a rightmost peak in the distribution of the signal envelope,
  wherein:
  the peak is a state where any step value is greater than a threshold value, a value of a step previous to the step and a value of a step next to the step, in the distribution of the signal envelope; and
  the length of the rightmost peak is the number of the steps having a value greater than the threshold value among the steps which are located in at least one step higher than or at least one step lower than the step having the rightmost peak.

16. The auto gain control method of claim 13, wherein the calculating of the component ratio comprises:
- setting a lower saturation value and an upper saturation value;
- saturating the component ratio to the lower saturation value when the calculated component ratio is lower than the lower saturation value; and
- saturating the component ratio to the upper saturation value when the calculated component ratio is higher than the upper saturation value.

17. The auto gain control method of claim 4, wherein when the state of the current gain value is the upper near range state, the gain value is identically controlled by the same way in the normal range state.

* * * * *